US011522355B2

United States Patent
Wahlroos et al.

(10) Patent No.: US 11,522,355 B2
(45) Date of Patent: Dec. 6, 2022

(54) METHOD AND APPARATUS FOR USE IN EARTH-FAULT PROTECTION

(71) Applicant: ABB Schweiz AG, Baden (CH)

(72) Inventors: Ari Wahlroos, Vaasa (FI); Janne Altonen, Tampere (FI)

(73) Assignee: ABB Schweiz AG, Baden (CH)

( * ) Notice: Subject to any disclaimer, the term of this patent is extended or adjusted under 35 U.S.C. 154(b) by 76 days.

(21) Appl. No.: 17/084,733

(22) Filed: Oct. 30, 2020

(65) Prior Publication Data
US 2021/0075210 A1 Mar. 11, 2021

Related U.S. Application Data

(63) Continuation of application No. PCT/EP2019/062775, filed on May 17, 2019.

(30) Foreign Application Priority Data

May 18, 2018 (EP) ..................... 18173236

(51) Int. Cl.
*H02H 3/16* (2006.01)
*G01R 31/52* (2020.01)
*G01R 31/08* (2020.01)

(52) U.S. Cl.
CPC ........... *H02H 3/165* (2013.01); *G01R 31/086* (2013.01); *G01R 31/52* (2020.01); *G01R 31/083* (2013.01)

(58) Field of Classification Search
CPC ............. H01L 21/6833; H01L 21/3065; H01L 21/67109; H01L 21/68742; H01L 21/6875;

(Continued)

(56) References Cited

U.S. PATENT DOCUMENTS 4,529,929 A 7/1985 Berggren
4,878,142 A * 10/1989 Bergman ............... G01R 31/52
361/84

(Continued)

FOREIGN PATENT DOCUMENTS

CN 102224427 A 10/2011
CN 102959413 A 3/2013

(Continued)

OTHER PUBLICATIONS

European Patent Office, International Search Report & Written Opinion issued in corresponding Application No. PCT/EP2019/062775, dated Sep. 4, 2019, 10 pp.

(Continued)

*Primary Examiner* — Dharti H Patel
(74) *Attorney, Agent, or Firm* — Leydig, Voit & Mayer, Ltd.

(57) ABSTRACT

A method and an apparatus for use in an earth-fault protection in a three-phase electric network, the apparatus is configured to detect a phase-to-earth fault in the network, to determine for each of the phases of the network a phase current during the fault or a change in the phase current due to the fault, to detect a faulted phase of the network, to determine an estimate of an earth-fault current on the basis of the faulted phase and the phase currents or the changes in the phase currents, to determine a zero-sequence voltage of the electric network or a change in the zero-sequence voltage, and to determine a direction of the phase-to-earth fault from the measuring point on the basis of the estimate of the earth-fault current and the zero-sequence voltage or the change in the zero-sequence voltage.

19 Claims, 2 Drawing Sheets

(58) Field of Classification Search
CPC . H01L 21/6831; H01L 22/14; C23C 16/4586; C23C 16/5096; H01J 37/32091; H01J 37/32715; B23Q 3/15; H02N 13/00
USPC .................................................. 361/42–50
See application file for complete search history.

(56) References Cited

U.S. PATENT DOCUMENTS

| | | |
|---|---|---|
| 6,584,417 B1 | 6/2003 | Hu et al. |
| 2008/0211511 A1 | 9/2008 | Choi et al. |
| 2016/0091555 A1 | 3/2016 | Drouere et al. |
| 2016/0266193 A1 | 9/2016 | Ennis et al. |

FOREIGN PATENT DOCUMENTS

| | | |
|---|---|---|
| CN | 103576045 A | 2/2014 |
| EP | 0082103 A1 | 6/1983 |
| EP | 1682909 A1 | 7/2006 |
| EP | 2733498 A2 | 5/2014 |
| WO | 2005038474 A1 | 4/2005 |

OTHER PUBLICATIONS

European Patent Office, Extended Search Report issued in corresponding Application No. 18173236.3, dated Dec. 5, 2018, 8 pp.
China National Intellectual Property Administration, Office Action in Chinese Patent Application No. 201980032077.8, 12 pp. (dated Mar. 11, 2022).

\* cited by examiner

METHOD AND APPARATUS FOR USE IN EARTH-FAULT PROTECTION

FIELD OF THE INVENTION

The present invention relates to a method and an apparatus for use in earth-fault protection in a three-phase electric network.

BACKGROUND OF THE INVENTION

Earth-fault protection functions in high-impedance earthed networks, such as compensated, unearthed or high resistance earthed networks, may be based on a measurement of a zero-sequence voltage $\overline{U}_0$ (or neutral point voltage, residual voltage $\overline{U}_o$) of the network $\overline{U}_o = \overline{U}_0 = (\overline{U}_A + \overline{U}_B + \overline{U}_C)/3$ and a residual current (or sum current) at a measuring point $\overline{I}_o = 3 \cdot \overline{I}_0 = \overline{I}_A + \overline{I}_B + \overline{I}_C$. Monitoring a magnitude of the neutral point voltage $\overline{U}_o$ and comparing it to a predetermined setting value may be used as a general indication of an earth-fault somewhere in a galvanically connected network. Detection of a faulty and healthy feeder, or generally the fault direction seen from the measuring point, is however not possible from only the neutral point voltage $\overline{U}_o$, but it requires additionally e.g. the measurement of the residual current $\overline{I}_o = 3 \cdot \overline{I}_o = \overline{I}_A + \overline{I}_B + \overline{I}_C$. Furthermore, especially in compensated and unearthed networks, the magnitude of the residual current may not be a selective indication of the fault direction, and more advanced methods may be needed.

There may be a selectivity requirement for earth-protection functions. This means that only a "true" faulty feeder or faulty section of feeder, for example, should be detected as faulty. The healthy feeder or healthy section of feeder, for example, must not be detected as faulty in order to avoid unnecessary disconnection of a healthy part of the network, resulting in unwanted outages for the end customers, for instance.

Some practically used protection functions applied in high-impedance earthed networks can be divided into four groups:
1. Current based methods
2. Power based methods
3. Admittance based methods
4. Any combination of 1-3

In current based methods, an operation quantity of the protection is the residual current $\overline{I}_o$-phasor, whose amplitude, real- or imaginary part, or phase angle, may be compared to a predefined threshold(s). In power based methods, the operation quantity of the protection is the residual power $\overline{S}_o$-phasor ($\overline{S}_o = \overline{I}_o \cdot \overline{U}_o$), whose amplitude, real- or imaginary part, or phase angle, may be compared to a predefined threshold(s). And in admittance based methods, the operation quantity of the protection is the residual (neutral) admittance $\overline{Y}_o$-phasor ($\overline{Y}_o = \overline{I}_o / \overline{U}_0$), whose amplitude, real- or imaginary part, or phase angle, may be compared to a predefined threshold(s). Especially in compensated and unearthed networks, the amplitude-criterion is generally not a selective indication of the fault direction.

In compensated networks, for example, the residual current $\overline{I}_o$ measured at the beginning of a feeder may not generally equal the earth-fault current $\overline{I}_{ef}$ flowing at the fault location from the faulted phase to earth. The residual current is typically only a part of the earth-fault-current and the relation between them can be written as:

$$\overline{I}_{ef} = \overline{I}_o + \overline{I}_{efFd} \text{ or} \qquad \text{Eq. 1a}$$

$$\overline{I}_o = \overline{I}_{ef} - \overline{I}_{efFd} \qquad \text{Eq. 1b}$$

where
$\overline{I}_{efFd}$ equals the part of the earth-fault current produced by the faulty feeder itself. The value for $\overline{I}_{efFd}$ during a solid earth fault (i.e. the fault resistance equals zero ohms) can be approximated by using Equation 2 (neglecting the natural resistive losses of the feeder itself):

$$\overline{I}_{efFd} \approx j \cdot 3 \cdot C_{0Fd} \cdot \omega \cdot U_{PE} \qquad \text{Eq. 2}$$

where
$\overline{I}_{efFd}$ is the uncompensated earth-fault current of the feeder
$\omega = 2 \cdot \pi \cdot f_n$ is the nominal angular frequency of the network,
$f_n$ is the nominal frequency of the network (e.g. 50 Hz or 60 Hz)
$C_{0Fd}$ is the total phase-to-earth capacitance of the feeder (per phase)
$U_{PE}$ is the operating phase-to-earth voltage magnitude.

From Equations 1a, 1b and 2 it can be concluded that the value of $\overline{I}_{efFd}$ may increase in modern networks (especially in rural networks) due to an increased share in installation of underground cables (value of $C_{0Fd}$ is typically significantly higher for cables compared with overhead lines), for example, and the difference between $\overline{I}_o$ and $\overline{I}_{ef}$ may thus become ever larger. This means that the residual current $\overline{I}_o$ may become worse and worse representation of the earth-fault current $\overline{I}_{ef}$ flowing at the fault location.

A problem of the solutions utilizing the residual current in earth-fault protection functions is that the earth-fault current $\overline{I}_{ef}$ may have a different magnitude due to changes in the electric network, such as any topology change in the electric network, for example, which can be due to a fault or disturbance, and the fault location and restoration process that may succeed. Also, the earth-fault current $\overline{I}_{ef}$ may have a larger than expected magnitude due to an internal failure in a compensation coil tuning system, for example. In such a case, the compensation coil may be severely detuned until the failure becomes detected, and repaired or replaced. During such conditions, for instance, the earth-fault protection based on the residual current may not operate accurately and fast enough, which may create a high risk for personal safety and equipment failure, for example.

BRIEF DESCRIPTION OF THE INVENTION

An object of the present invention is to provide a method and an apparatus for implementing the method so as to solve or at least alleviate the above problem or to provide an alternative solution. The objects of the invention are achieved by a method, a computer program product and an apparatus, which are characterized by what is stated in the independent claims. The preferred embodiments of the invention are disclosed in the dependent claims.

The invention is based on the idea of determining an estimate of an earth-fault current in a point of a phase-to-earth fault passing through a measuring point on the basis of a faulted phase and determined phase currents of the three phases of the three-phase electric network, such that the estimate is based on a negative-sequence current component, or on the basis of the faulted phase and determined changes in the phase currents of the three phases of the three-phase electric network, and then determining a direction of the phase-to-earth fault from the measuring point on the basis of the determined estimate of the earth-fault current and a zero-sequence voltage or on the basis of the determined estimate of the earth-fault current and a change in the zero-sequence voltage.

An advantage of the method and apparatus of the invention is that the direction of the earth-fault can be determined accurately, which improves the dependability of earth-fault protection.

BRIEF DESCRIPTION OF THE DRAWINGS

In the following the invention will be described in greater detail by means of preferred embodiments with reference to the attached drawings, in which.

DETAILED DESCRIPTION OF THE INVENTION

The application of the various embodiments described herein is not limited to any specific system, but it can be used in connection with the earth-fault protection of various three-phase electric networks. As an example, the embodiments can be utilized in unearthed networks with an unearthed or isolated neutral, i.e. which have no intentional neutral point grounding but are grounded only by the natural phase-to-earth capacitances of the network. As another example, the embodiments can be utilized in compensated networks with a compensated neutral, also known as a resonant earthed networks, where compensation of the fault current is achieved by installing one or more (Petersen) coils into neutral point(s) of the system. As a yet another example, the various embodiments can be utilized in impedance earthed networks with a neutral point provided with a resistance and/or reactance grounding, such as a high resistance and/or reactance grounding. In such networks with a high resistance earthed neutral point the value of the grounding resistance may be selected such that its value essentially corresponds to a resulting capacitive reactance of phase-to-earth admittances (~capacitances) of the galvanically connected network, for instance, such that an earth-fault current is limited approximately to a value equal to or slightly greater than the uncompensated capacitive earth-fault current of the network. The electric network, in which the various embodiments may be implemented, can be an electric power transmission or distribution network or a component thereof, for example, and may comprise several electric lines or sections. The electric network may have a radial configuration supplied from one point thereof or a loop configuration comprising one or more loops and supplied from two or more points, for instance. Moreover, the use of the various embodiments is not limited to systems employing 50 Hz or 60 Hz fundamental frequencies or to any specific voltage level.

Figure 1:
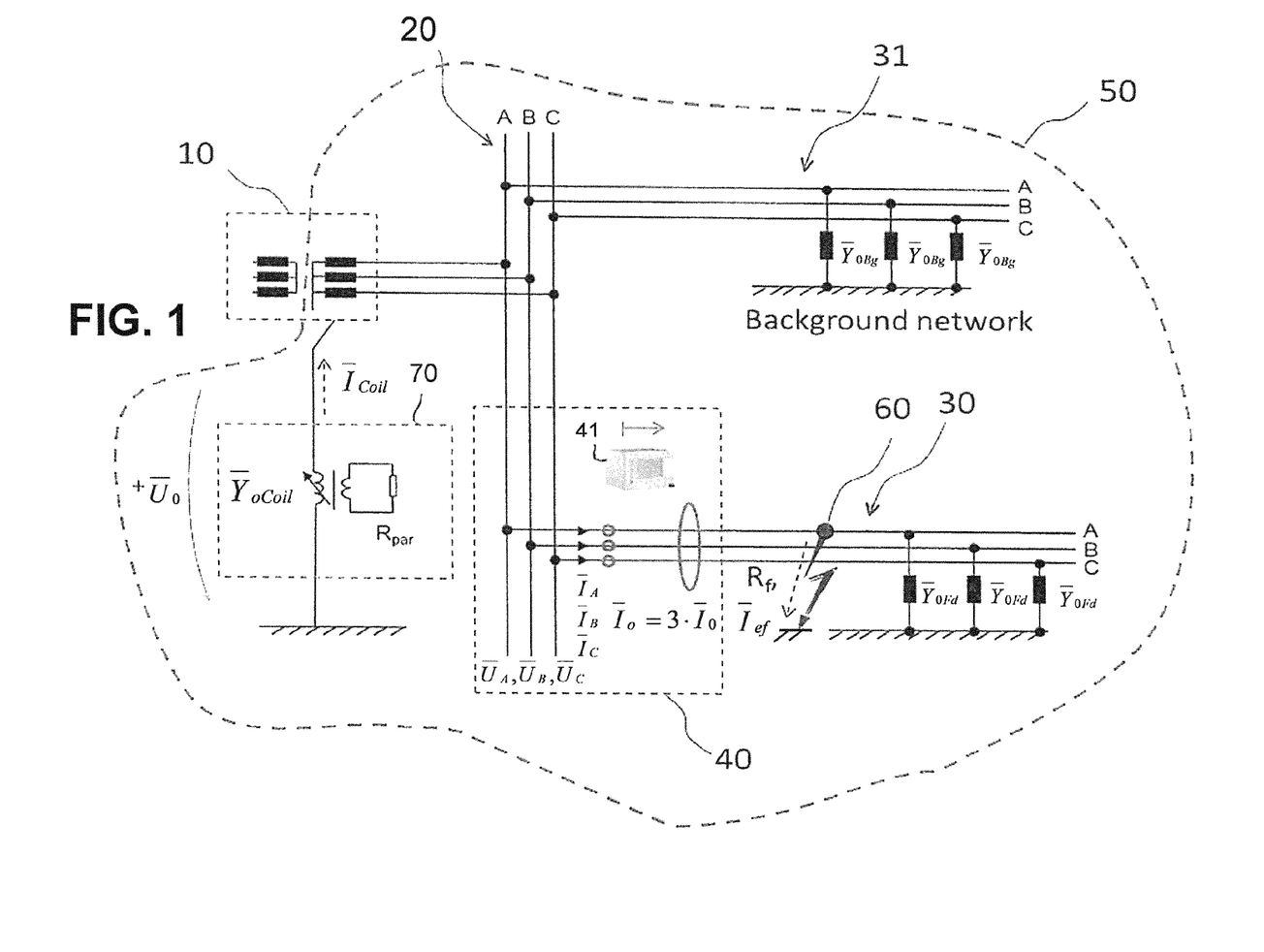
FIG. 1 shows an example of an electric network according to an embodiment.

FIG. 1 is a simplified diagram illustrating an electric network 50 in which the various embodiments can be applied. The figure shows only the components necessary for understanding the various embodiments. The exemplary three-phase network 50 with phases A, B and C may be a medium voltage (e.g. 20 kV) distribution network fed through a substation comprising a transformer 10 and a busbar 20. The exemplary network also comprises electric line outlets, i.e. feeders, of which one 30 is shown separately and represented by phase-to-earth admittances $\overline{Y}_{0Fd}$ in the figure. Other possible feeders as well as other network parts, except the line 30, are referred to as a 'background network' 31 represented by phase-to-earth admittances $\overline{Y}_{0Bg}$ in the figure. The illustrated network further comprises a compensation coil 70, which can be connected to the neutral point of the network via the transformer 10, for example. An admittance of the coil is $\overline{Y}_{oCoil}$ and a resistance in parallel of the coil is $R_{par}$. $\overline{I}_{Coil}$ is the current flowing through the coil 70. The figure also shows a connection arrangement 40 comprising at least one protective relay unit 41 at the connection point of the electric line 30 to the substation 10, 20, and a point of a phase-to-earth fault 60 occurring in phase A. The term 'phase-to-earth fault' herein generally refers to a single phase-to-earth fault. The protective relay unit 41 may be configured to detect an earth fault 60 on the basis of suitable measurements and consequently to operate the earth-fault protection of the electric line 30. The operating of the earth-fault protection may comprise tripping one or more switching devices in the three-phase electric network and/or preventing (blocking) a tripping of one or more switching devices in the three-phase electric network. Additionally or alternatively, the operating of the earth-fault protection may comprise switching off or limiting the earth-fault current of the detected earth fault 60 on the three-phase electric line 30 and/or performing an alarm, for example. Switching off the earth-fault current of the detected earth fault 60 could be performed by switching off the electric line 30 from the feeding point, such as the substation 10, 20, with suitable switching means, such as a circuit breaker or other kind of switchgear, which may be included in the connection arrangement 40. Limiting the earth-fault current of the detected earth fault 60 could be performed by limiting or reducing, without a complete disconnection, the earth-fault current flowing to the electric line 30 from the feeding point with suitable fault current controller means. This may be based on controlling the coil 70 during an earth-fault, for example. Such a limiting of the earth-fault current may also be performed as a preliminary procedure before switching off the earth-fault current, for example. It should be noted that there may be any number of feeders or other network elements in the network. There may also be several feeding substations. Further, the invention can be utilized with a switching station without a transformer 10, for example. In the exemplary system of FIG. 1, the functionality of the invention may be located in the relay unit 41, for example. It is also possible that e.g. only some measurements are performed at the location of the relay unit 41 and the results are then transmitted to another unit or units (not shown in the figures) at another location for further processing. In other words, the relay unit 41 could be a mere measuring unit, while the functionality of the invention, or part of it, could be located in another unit or units possibly located elsewhere.

Current and voltage values that may be needed in the following embodiments may be obtained by a suitable measuring arrangement including e.g. current and/or voltage transducers at a measuring point, which may be located at the location 40 of the relay unit 41, for example. Voltage and current quantities may also be measured at different locations, for instance. In most of the existing protection systems, such values are readily available and thus the implementation of the various embodiments does not necessarily require any additional measuring arrangements or devices. How the possible current and voltage values are obtained depends, however, on the particular electric network 50. E.g. phase currents $I_A$, $I_B$, $I_C$ of the three-phase electric line 30 of the three-phase electric network 50 and/or other current and/or voltage quantities possibly needed in the various embodiments may be monitored essentially continuously or the monitoring of at least some quantities may start only upon detecting an earth fault depending on whether pre-fault values for the quantity in question are needed or not, for instance.

Figure 2:
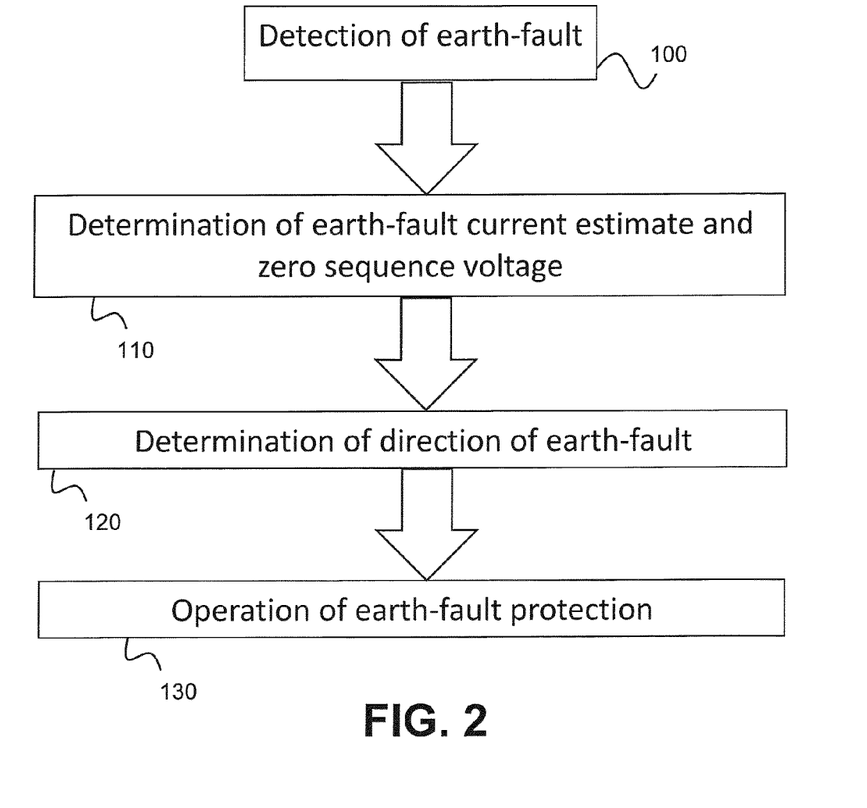
FIG. 2 shows a flow chart according to an embodiment.

FIG. 2 shows a flow chart according to an embodiment, an example of which is described in the following.

According to an embodiment, a phase-to-earth fault is detected 100 in the three-phase electric network 50. Then, a phase current during the detected phase-to-earth fault is determined or a change in the phase current due to the detected phase-to-earth fault is determined at a measuring point in the three-phase electric network 50, for each of the three phases A, B, C of the three-phase electric network, and a faulted phase of the three-phase electric network is detected. The determination of the faulted phase can be performed with any known method applicable. An estimate of an earth-fault current in a point of the detected phase-to-earth fault 60 passing through the measuring point 40 is determined 110 on the basis of the faulted phase and the determined phase currents of the three phases of the three-phase electric network, such that the estimate is based on a negative-sequence current component, or on the basis of the faulted phase and the determined changes in the phase currents of the three phases of the three-phase electric network. In addition, a zero-sequence voltage of the three-phase electric network during the detected phase-to-earth fault or a change in the zero-sequence voltage of the three-phase electric network due to the detected phase-to-earth fault is determined 110. The determination of the zero-sequence voltage or the change in the zero-sequence voltage can take place before during and/or after the determination of the estimate of the earth-fault current. The determination of the zero-sequence voltage or the change in the zero-sequence voltage can be performed with any known method applicable. The zero-sequence voltage may be obtained from an open-delta winding of a three phase voltage transformer or may be calculated from the phase-to-earth voltages: $\overline{U}_0{}^n = (\overline{U}_A{}^n + \overline{U}_B{}^n + \overline{U}_C{}^n)/3$ (notation n refers to any integer number >1, as a multiple of network fundamental frequency), for example. Next, a direction of the phase-to-earth fault from the measuring point 40 is determined 120 on the basis of the determined estimate of the earth-fault current and the determined zero-sequence voltage or the determined change in the zero-sequence voltage. The direction of the fault generally refers to the direction, seen from a point of observation, such as the measuring point, in which the fault is located in the electric network. As an example, if the measuring point 40 is located in the beginning of an electric line outlet 30, then the direction of the fault can be either towards the line outlet 30, i.e. the fault is located within the line outlet 30 (in the example of FIG. 1, the arrow in connection with the relay unit 41 shows the fault 60 direction as towards the line outlet 30), or away from the line outlet 30, i.e. the fault is located within the substation 10, 20 or within the background network 31, for example. In such a case, the determined direction of the fault can thus be used to determine if a single feeder or line outlet including its possible branches or sections is faulted or healthy. Also in case of two or more parallel feeders or line outlets, each of which is provided with a measuring point located in the beginning thereof, it is possible to determine which feeder or line outlet out of said two or more parallel feeders or line outlets is faulted.

According to an embodiment, the earth-fault protection in the three-phase electric network is operated 130 on the basis of the determined direction of the phase-to-earth fault from the measuring point 40.

According to an embodiment, the operating of the earth-fault protection comprises tripping one or more switching devices in the three-phase electric network and/or preventing a tripping of one or more switching devices in the three-phase electric network, and/or switching off or limiting the earth-fault current of the detected phase-to-earth fault in the three-phase electric network. The operating of the earth-fault protection may also comprise further or alternative measures or actions depending on the electric system in question, for instance.

The detection 100 of the phase-to-earth fault can be performed with any known method applicable in the type of network in question such as compensated, unearthed or high resistance earthed network.

According to an embodiment, the detection 100 of the phase-to-earth fault comprises, either essentially continuous or intermittent, monitoring of a zero-sequence voltage magnitude (fundamental frequency, notated with superscript index 1), or a change in the magnitude, between at least two time instances $t_1$, $t_2$, where $t_1 > t_2$, and comparing it to a predetermined threshold (the change can be calculated from zero-sequence voltage phasors or magnitudes):

$abs(\overline{U}_0{}^1) >$ U0_start_threshold or $abs(\overline{U}_{0\_t1}{}^1 - \overline{U}_{0\_t2}{}^1) >$ U0_start_threshold (change of phasor magnitude) or $abs(\overline{U}_{0\_t1}{}^1) - abs(\overline{U}_{0\_t2}{}^1) >$ U0_start_threshold (change of magnitude), where subscripts t1 and t2 relate to different time instances (t1>t2)

Monitoring of the zero-sequence voltage magnitude (a fundamental frequency component magnitude exceeds the threshold or a change in the magnitude between at least two time instances $t_1$, $t_2$, where $t_1 > t_2$, exceeds threshold) gives a very secure indication of a single phase-to-earth fault somewhere in the galvanically connected network. A favorable feature of the zero-sequence voltage is that it is not present during non-fault related phenomena in the network, such as switching transients or inrush current events, which may confuse some other earth-fault detection criteria.

Setting value U0_start_threshold should preferably be set as low value as possible in order to maximize the fault detection sensitivity (in terms of fault resistance). However, in order to avoid false fault detection during healthy state of the network, the detection threshold should preferably be set to a higher value (with a margin) than the zero-sequence voltage created during a healthy state due to a network phase-to-earth admittance imbalance.

According to an embodiment, in a compensated network the U0_start_threshold is not predetermined, but may be determined in real time. This may be performed by a Petersen coil regulator (i.e. a controller of a Petersen coil in the compensated network) or another unit or system connected thereto, for example. The maximum value of the zero-sequence voltage is determined during the healthy state due to the admittance imbalance of the system, Uomax_healthy_state. When the maximum value of zero-sequence voltage during the healthy state is determined, then U0_start_threshold may be determined automatically in real time as:

U0_start_threshold≥Uomax_healthy_state*q0, where q0>1 is a user defined security margin. This embodiment may enable an increased sensitivity for earth-fault detection.

According to an embodiment, the detection 100 of the phase-to-earth fault additionally or alternatively comprises monitoring of three times negative-sequence current magnitude (only fundamental frequency, fundamental frequency plus harmonics or only harmonics), or a change in the magnitude between at least two time instances $t_1$, $t_2$, where $t_1 > t_2$, and comparing it to pre-set threshold:

$\sqrt{\Sigma_n^m (3 \cdot abs(\overline{I}_2^n))^2} > 312\_start\_threshold$ (with a settable pick-up delay), or $\sqrt{\Sigma_n^m (3 \cdot abs(\overline{I}_{2\_t1}^n))^2} - \sqrt{\Sigma_n^m (3 \cdot (\overline{I}_{2\_t2}^n))^2} > 312\_start\_threshold$ (with a settable pick-up delay), or $\sqrt{\Sigma_n^m (3 \cdot abs(\overline{I}_{2\_t1}^n - \overline{I}_{2\_t2}^n))^2} > 312\_start\_threshold$ (with a settable pick-up delay), where n and m refer to the frequency component as a multiple of network fundamental frequency.

n=1, m=1 or n=1 and m=any integer number >1 or n=any integer number >1, and m is any integer number >n, where subscripts t1 and t2 relate to different time instances (t1>t2)

and where $\overline{I}_2^n = (\overline{I}_A^n + \overline{I}_B^n \cdot \overline{a} \cdot a + \overline{I}_C^n \cdot \overline{a})/3$ is the negative-sequence current component calculated at frequency $f_n * n$ (n=any integer number≥1) according to the theory of symmetrical components, where $$\overline{a} = \frac{-1 + j \cdot \sqrt{3}}{2}$$

As the negative-sequence current may be created also during non-fault related phenomena in the network, such as load imbalance (i.e. the negative-sequence current is a load dependent and therefore also time dependent quantity), switching inrush condition and saturation of phase current transformers, the pick-up of earth-fault detection should preferably be set to a higher value than the three times negative-sequence current magnitude measured during the healthy-state of the network. Due to the fact that a healthy-state level may vary due to time dependent nature of loads and topology changes in the network, this detection method may not be as sensitive as a zero-sequence voltage based fault detection method. Fault detection sensitivity based on negative-sequence current magnitude may be increased by monitoring its change in magnitude between at least two time instances $t_1$, $t_2$, where $t_1 > t_2$, and comparing it to pre-set threshold. But also here, the change may be due to changes in loads. Therefore, generally, this fault detection may not be set as sensitive as the method based on the zero-sequence voltage, in order to avoid erroneous fault detections.

The pick-up of earth-fault detection based on the three times negative-sequence current magnitude should preferably be delayed, so that transient phenomena creating negative-sequence current are filtered out. This means in practice, that the overcurrent condition should be valid at least a certain duration without a temporary drop-off in order to provide the final earth-fault detection. With this condition, only a permanent source of negative-sequence current, i.e. a single-phase-to-earth fault, should preferably be detected as an earth fault. The detection of the phase-to-earth fault based on three times negative-sequence current can be used especially for coarse detection of relative high-current continuous earth faults.

According to an embodiment, in a compensated network the 312_start_threshold is not predetermined, but may be determined in real time. This may be performed by the Petersen coil regulator or another unit or system connected thereto, for example. The total system damping in amperes (Id) is determined and has a set detuning value in amperes (Iv). From these values the expected earth-fault current can be determined as: Ief_comp=abs(Id+j*Iv). When the expected earth-fault current is determined, then the 312_start_threshold can be determined automatically in real time as:

312_start_threshold≤Ief_comp*q1, where q1<1 is a user defined security margin. This embodiment may enable an increased sensitivity for earth-fault detection.

According to an embodiment, the detection 100 of the phase-to-earth fault additionally or alternatively comprises a monitoring of three times zero-sequence current magnitude (only fundamental frequency, fundamental frequency plus harmonics or only harmonics), or a change in a magnitude between at least two time instances $t_1$, $t_2$, where $t_1 > t_2$, and comparing it to pre-set threshold:

$\sqrt{\Sigma_n^m (3 \cdot abs(\overline{I}_0^n))^2} > Io\_start\_threshold$ (with a settable pick-up delay), or $\sqrt{\Sigma_n^m (3 \cdot abs(\overline{I}_{0\_t1}^n))^2} - \sqrt{\Sigma_n^m (3 \cdot (\overline{I}_{0\_t2}^n))^2} > Io\_start\_threshold$ (with a settable pick-up delay), or $\sqrt{\Sigma_n^m (3 \cdot abs(\overline{I}_{0\_t1}^n - \overline{I}_{0\_t2}^n))^2} > Io\_start\_threshold$ (with a settable pick-up delay), where n and m refer to the frequency component as a multiple of network fundamental frequency.

n=1, m=1 or n=1 and m=any integer number >1 or n=any integer number >1, and m is any integer number >n, where subscripts t1 and t2 relate to different time instances (t1>t2)

and where $\overline{I}_0^n = (\overline{I}_A^n + \overline{I}_B^n + \overline{I}_C^n)/3$ is the zero-sequence current component calculated at frequency $f_n * n$ (n=any integer number≥1) according to the theory of symmetrical components.

This fault detection method may be only valid, when the three times zero-sequence current has a significantly different value in the faulty and the healthy feeders. This condition may be only valid in unearthed networks, where earth-fault current produced by a protected feeder is significantly smaller compared with the total uncompensated earth-fault current of the network.

According to an embodiment, the estimate of the earth-fault current in the point of the detected phase-to-earth fault passing through the measuring point may be determined on the basis of the faulted phase and the determined phase currents of the three phases of the three-phase electric network, such that the estimate is based on a negative-sequence current component. An example of this embodiment is equation 3b below. According to another embodiment, the estimate of the earth-fault current in the point of the detected phase-to-earth fault passing through the measuring point may be determined on the basis of the faulted phase and the determined changes in the phase currents of the three phases of the three-phase electric network. Examples of this embodiment include equations 3a, 4a, and 5a-5c below.

According to an embodiment, the determining of the changes in the phase currents of the three phases of the three-phase electric network comprises determining, for each of the three phases A, B, C of the three-phase electric network 50, a difference between a fundamental frequency component of the phase current during the phase-to-earth fault and the fundamental frequency component of the phase current before the phase-to-earth fault.

According to an embodiment, the determining of the changes in the phase currents of the three phases of the three-phase electric network additionally or alternatively comprises determining, for each of the three phases A, B, C of the three-phase electric network, and for at least one harmonic frequency, which is an integer multiple of the fundamental frequency of the phase current, a difference between a harmonic frequency component of the phase current during the phase-to-earth fault and the harmonic frequency component of the phase current before the phase-to-earth fault. Thus, it is possible to use only the fundamental frequency components of the phase currents, only one or more harmonic frequency components, or both the fundamental frequency components and one or more harmonic frequency components for the determining of the changes in the phase currents of the three phases of the three-phase electric network.

The estimate of the earth-fault current in the point of the detected phase-to-earth fault passing through the measuring point may be determined according to the various embodiments, or a combination thereof, described in the following. Phase currents at the measuring point 40 are measured including measuring the fundamental frequency $f_n$ component and/or one or more harmonic components (n=2, 3, 4, 5, ...). For example, in some systems e.g. $5^{th}$ and $7^{th}$ harmonic components may be dominant in practice in the earth-fault current and could be included in the measurement in addition to the fundamental component. Any harmonic component or components may be included in the measurement, if their magnitude is sufficient for an accurate measurement. This minimum value of harmonic component magnitude may be a predetermined value and it may be determined by the accuracy of the used hardware and applied measurements, for example.

A general format for phase current phasors at frequency $n*f_n$, where $f_n$ is the fundamental system frequency, can be written as:

$\overline{I}_A^n$ is the phase A current phasor at frequency $n*f_n$,
$\overline{I}_B^n$ is the phase B current phasor at frequency $n*f_n$,
$\overline{I}_C^n$ is the phase C current phasor at frequency $n*f_n$,
where n=any integer number≥1

The "delta" or change quantities for each of the phase current phasors may be derived (if needed in the calculations later), preferably essentially real-time, during the detected phase-to-earth fault in accordance with the following equations:

$$\Delta \overline{I}_A^n = \overline{I}_{A\_tF}^n - \overline{I}_{A\_tP}^n$$

$$\Delta \overline{I}_B^n = \overline{I}_{B\_tF}^n - \overline{I}_{B\_tP}^n$$

$$\Delta \overline{I}_C^n = \overline{I}_{C\_tF}^n - \overline{I}_{C\_tP}^n$$

where subscript tF relates to a time instance during the detected earth fault and tP relates to a time instance before the detected earth fault (tF>tP)

The use of the measurable change due to an earth fault at phase current phasors, enables accurate estimation of the earth-fault current.

According to an embodiment, the estimate of the earth-fault current in the point of the detected phase-to-earth fault passing through the measuring point can be determined 110 by using any of the following equations 3a, 3b, 4a, and 5a-5c, which can be evaluated individually or together. A-B-C phase rotation is assumed in the exemplary equations:

Equation 3a (based on a change due to earth fault in a negative-sequence current component):
Phase A-to-earth fault:

$$\overline{I}_{efA}^n = (\Delta\overline{I}_A^n + \Delta\overline{I}_B^n \cdot \overline{a} \cdot \overline{a} + \Delta\overline{I}_C^n \cdot \overline{a}) = 3 \cdot \Delta\overline{I}_{2A}^n = 3 \cdot (\overline{I}_{2A\_tF}^n - \overline{I}_{2A\_tP}^n) \quad \text{Eq. 3a1}$$

Phase B-to-earth fault:

$$\overline{I}_{efB}^n = (\Delta\overline{I}_A^n + \Delta\overline{I}_B^n \cdot \overline{a} \cdot \overline{a} + \Delta\overline{I}_C^n \cdot \overline{a}) = 3 \cdot \Delta\overline{I}_{2B}^n = 3 \cdot (\overline{I}_{2B\_tF}^n - \overline{I}_{2B\_tP}^n) \quad \text{Eq. 3a2}$$

Phase C-to-earth fault:

$$\overline{I}_{efC}^n = (\Delta\overline{I}_A^n + \Delta\overline{I}_B^n \cdot \overline{a} \cdot \overline{a} + \Delta\overline{I}_C^n \cdot \overline{a}) = 3 \cdot \Delta\overline{I}_{2C}^n = 3 \cdot (\overline{I}_{2C\_tF}^n - \overline{I}_{2C\_tP}^n) \quad \text{Eq. 3a2}$$

Equation 3b (based on the negative-sequence current component during the fault without pre-fault data):
Phase A-to-earth fault:

$$\overline{I}_{efA}^n = (\overline{I}_A^n + \overline{I}_B^n \cdot \overline{a} \cdot \overline{a} + \overline{I}_C^n \cdot \overline{a}) = 3 \cdot \overline{I}_{2A}^n = 3 \cdot \overline{I}_{2A\_tF}^n \quad \text{Eq. 3b1}$$

Phase B-to-earth fault:

$$\overline{I}_{efB}^n = (\overline{I}_A^n + \overline{I}_B^n \cdot \overline{a} \cdot \overline{a} + \overline{I}_C^n \cdot \overline{a}) = 3 \cdot \overline{I}_{2B}^n = 3 \cdot \overline{I}_{2B\_tF}^n \quad \text{Eq. 3b2}$$

Phase C-to-earth fault:

$$\overline{I}_{efC}^n = (\overline{I}_A^n + \overline{I}_B^n \cdot \overline{a} \cdot \overline{a} + \overline{I}_C^n \cdot \overline{a}) = 3 \cdot \overline{I}_{2C}^n = 3 \cdot \overline{I}_{2C\_tF}^n \quad \text{Eq. 3b3}$$

Equation 4a (based on a change due to earth fault in a positive-sequence current component):
Phase A-to-earth fault:

$$\overline{I}_{efA}^n = \Delta\overline{I}_A^n + \Delta\overline{I}_B^n \cdot \overline{a} + \Delta\overline{I}_C^n \cdot \overline{a} \cdot \overline{a} = 3 \cdot \Delta\overline{I}_{1A}^n = 3 \cdot (\overline{I}_{1A\_tF}^n - \overline{I}_{1A\_tP}^n) \quad \text{Eq. 4a1}$$

Phase B-to-earth fault:

$$\overline{I}_{efB}^n = \Delta\overline{I}_A^n + \Delta\overline{I}_B^n \cdot \overline{a} + \Delta\overline{I}_C^n \cdot \overline{a} \cdot \overline{a} = 3 \cdot \Delta\overline{I}_{1B}^n = 3 \cdot (\overline{I}_{1B\_tF}^n - \overline{I}_{1A\_tP}^n) \quad \text{Eq. 4a2}$$

Phase C-to-earth fault:

$$\overline{I}_{efC}^n = \Delta\overline{I}_A^n + \Delta\overline{I}_B^n \cdot \overline{a} + \Delta\overline{I}_C^n \cdot \overline{a} \cdot \overline{a} = 3 \cdot \Delta\overline{I}_{1C}^n = 3 \cdot (\overline{I}_{1C\_tF}^n - \overline{I}_{1A\_tP}^n) \quad \text{Eq. 4a3}$$

Equations 5a-5c (Based on changes of phase currents due to earth fault):
Phase A-to-earth fault:

$$\overline{I}_{efA}^n = \Delta\overline{I}_A^n - \tfrac{1}{2}(\Delta\overline{I}_B^n + \Delta\overline{I}_C^n), \quad \text{Eq. 5a1 or}$$

$$\overline{I}_{efA}^n = \Delta\overline{I}_A^n - \Delta\overline{I}_B^n, \quad \text{Eq. 5a2 or}$$

$$\overline{I}_{efA}^n = \Delta\overline{I}_A^n - \Delta\overline{I}_C^n \quad \text{Eq. 5a3}$$

Phase B-to-earth fault:

$$\overline{I}_{efB}^n = \Delta\overline{I}_B^n - \tfrac{1}{2}(\Delta\overline{I}_C^n + \Delta\overline{I}_A^n), \quad \text{Eq. 5b1 or}$$

$$\overline{I}_{efB}^n = \Delta\overline{I}_B^n - \Delta\overline{I}_C^n, \quad \text{Eq. 5b2 or}$$

$$\overline{I}_{efB}^n = \Delta\overline{I}_B^n - \Delta\overline{I}_A^n \quad \text{Eq. 5b3}$$

Phase C-to-earth fault:

$$\overline{I}_{efC}^n = \Delta\overline{I}_C^n - \tfrac{1}{2}(\Delta\overline{I}_A^n + \Delta\overline{I}_B^n), \quad \text{Eq. 5c1 or}$$

$$\overline{I}_{efC}^n = \Delta\overline{I}_C^n - \Delta\overline{I}_A^n, \quad \text{Eq. 5c2 or}$$

$$\overline{I}_{efC}^n = \Delta\overline{I}_C^n - \Delta\overline{I}_B^n \quad \text{Eq. 5c3}$$

where $\overline{I}_{efA}^n$ is the estimate of the earth-fault current at frequency $n*f_n$ assuming phase A-to-earth fault $I_{efB}''$ is the estimate of the earth-fault current at frequency $n*f_n$ assuming phase B-to-earth fault $I_{efC}''$ is the estimate of the earth-fault current at frequency $n*f_n$ assuming phase C-to-earth fault $I_{2A}''$ is the negative-sequence current component at frequency $n*f_n$ assuming phase A-to-earth fault $I_{2B}''$ is the negative-sequence current component at frequency $n*f_n$ assuming phase B-to-earth fault $I_{2C}''$ is the negative-sequence current component at frequency $n*f_n$ assuming phase C-to-earth fault $\Delta I_{2A}''$ is the change in negative-sequence current component at frequency $n*f_n$ due to earth fault assuming phase A-to-earth fault.

$\Delta I_{2B}''$ is the change in negative-sequence current component at frequency $n*f_n$ due to earth fault assuming phase B-to-earth fault.

$\Delta I_{2C}''$ is the change in negative-sequence current component at frequency $n*f_n$ due to earth fault assuming phase C-to-earth fault.

$I_{1A}''$ is the positive-sequence current component at frequency $n*f_n$ assuming phase A-to-earth fault $I_{1B}''$ is the positive-sequence current component at frequency $n*f_n$ assuming phase B-to-earth fault $I_{1C}''$ is the positive-sequence current component at frequency $n*f_n$ assuming phase C-to-earth fault $\Delta I_{1A}''$ is the change in positive-sequence current component at frequency $n*f_n$ due to earth fault assuming phase A-to-earth fault.

$\Delta I_{1B}''$ is the change in positive-sequence current component at frequency $n*f_n$ due to earth fault assuming phase B-to-earth fault.

$\Delta I_{1C}''$ is the change in positive-sequence current component at frequency $n*f_n$ due to earth fault assuming phase C-to-earth fault.

n=1, 2, 3, . . . (integer number)

According to an embodiment, Equation 3b could be used in cases, where pre-fault current quantities are not available, for example. This may include special operating conditions such as switching onto fault or during an auto-reclosing sequence, for instance. Also, Equation 3b could be used in network conditions where the earth-fault current may be especially high, for example.

Determining an estimate of an earth-fault current and determining a direction of the phase-to-earth fault from the measuring point on the basis of the determined estimate of the earth-fault current may require that the faulted phase (phase A, phase B or phase C) of the electric network is detected. Based on the detected faulted phase the corresponding phase-specific earth-fault current phasor $I_{efA}''$, $I_{efB}''$, $I_{efC}''$, may be used as the phasor of the earth-fault current estimate $I_{ef}''$ in the directional determination of the phase-to-earth fault from the measuring point.

Such detection of the faulted phase could be performed with any known method, for instance. Alternatively, the detection of the faulted phase could be performed according to one or more of the following embodiments:

When Equations 5a1, 5b1 and 5c1 are applied:

max ($I_{efA}''$, $I_{efB}''$, $I_{efC}''$); the maximum value then indicates the faulted phase, When Equations 5a2, 5b2 and 5c2 are applied:

If $I_{efA}''$ provides the minimum, then healthy phases are A and B, and faulty phase is C If $I_{efB}''$ provides the minimum, then healthy phases are B and C, and faulty phase is A If $I_{efC}''$ provides the minimum, then healthy phases are C and A, and faulty phase is B When Equations 5a3, 5b3 and 5c3 are applied:

If $I_{efA}''$ provides the minimum, then healthy phases are A and C, and faulty phase is B If $I_{efB}''$ provides the minimum, then healthy phases are B and A, and faulty phase is C If $I_{efC}''$ provides the minimum, then healthy phases are C and B, and faulty phase is A And/or using the real parts of the phase-specific earth-fault current estimates (or derived earth-fault power and earth-fault admittance) with the zero-sequence voltage:

real $(I_{ef}'')$=max(real $(I_{efA}'')$, real$(I_{efB}'')$, real$(I_{efC}'')$); the maximum value then indicates the faulted phase.

where Equations 5a1-5a3 or 5b1-5b3 or 5c1-5c3 are applied

And/or by comparing the magnitude of the real-part of the operation quantity calculated with the fundamental frequency zero-sequence voltage and the zero-sequence current, including:

$$Io\ cos^1 = \text{real}(\bar{I}_o^1) = \text{abs}(\bar{I}_o^1) \cdot \cos(\text{phi}_0^1) \qquad \text{Eq. 6a1}$$

$$Po^1 = \text{real}(\bar{I}_o^1 \cdot \bar{U}_o^1) = \text{abs}(\bar{I}_o^1 \cdot \bar{U}_0^1) \cdot \cos(\text{phi}_0^1) \qquad \text{Eq. 6a2}$$

$$Go^1 = \text{real}(\bar{I}_o^1 / \bar{U}_0^1) = \text{abs}(\bar{I}_o^1 / \bar{U}_0^1) \cdot \cos(\text{phi}_0^1) \qquad \text{Eq. 6a3}$$

where $\text{phi}_0^1$ is the phase angle difference between $\bar{U}_0^1$ or $-\bar{U}_0^1$ and $\bar{I}_0^1$ phasors with the magnitude of the real-part of the operation quantity calculated with the fundamental frequency zero-sequence voltage and the estimated earth-fault current, $$Ief\ cos^1 = \text{real}(\bar{I}_{ef}^1) = \text{abs}(\bar{I}_{ef}^1) \cdot \cos(\text{phi}_{ef}^1) \qquad \text{Eq. 6a4}$$

$$Pef^1 = \text{real}(\bar{I}_{ef}^1 \cdot \bar{U}_0^1) = \text{abs}(\bar{I}_{ef}^1 \cdot \bar{U}_0^1) \cdot \cos(\text{phi}_{ef}^1) \qquad \text{Eq. 6a5}$$

$$Gef^1 = \text{real}(\bar{I}_{ef}^1 / \bar{U}_0^1) = \text{abs}(\bar{I}_{ef}^1 / \bar{U}_0^1) \cdot \cos(\text{phi}_{ef}^1) \qquad \text{Eq. 6a6}$$

where $\text{phi}_{ef}^1$ is the phase angle difference between $\bar{U}_0^1$ or $-\bar{U}_0^1$ and $\bar{I}ef^1$ phasors where three equations describing three possible phase-to-earth faults (phase A-to-earth, phase B-to-earth and phase C-to-earth) are derived. For example, when earth-fault admittance based equation Eq. 6a6 is applied, then the three equations describing three possible phase-to-earth faults are:

$$Gef_A^1 = \text{real}(\bar{I}_{efA}^1 / \bar{U}_0^1) = \text{abs}(\bar{I}_{efA}^1 / \bar{U}_0^1) \cdot \cos(\text{phi}_{efA}^1) \qquad \text{Eq. 6a6a}$$

$$Gef_B^1 = \text{real}(\bar{I}_{efB}^1 / \bar{U}_0^1) = \text{abs}(\bar{I}_{efB}^1 / \bar{U}_0^1) \cdot \cos(\text{phi}_{efB}^1) \qquad \text{Eq. 6a6b}$$

$$Gef_C^1 = \text{real}(\bar{I}_{efC}^1 / \bar{U}_0^1) = \text{abs}(\bar{I}_{efC}^1 / \bar{U}_0^1) \cdot \cos(\text{phi}_{efC}^1) \qquad \text{Eq. 6a6c}$$

The faulted phase can be identified as being the one, whose value is closest to the value calculated with the zero-sequence voltage and the zero-sequence current. Additionally the sign of the real-part of the operation quantity calculated with the fundamental frequency zero-sequence voltage and the zero-sequence current should agree with the sign of the phase specific real-part of the operation quantity calculated with the fundamental frequency zero-sequence voltage and the estimated earth-fault current.

According to an embodiment, the determination 120 of the direction of the phase-to-earth fault from the measuring point 40 on the basis of the determined estimate $I_{ef}''$ of the earth-fault current and the determined zero-sequence voltage or the determined change in the zero-sequence voltage can be based on a current based method, a power based method, an admittance based method or a combination thereof. Examples of such methods are given in the following.

In current based methods, the operation quantity is the earth-fault current estimate $I_{ef}''$-phasor, whose real- or imaginary part, or phase angle, for example, may be compared to a predefined threshold:
  a) Ief cos=real($\overline{I}_{ef}''$)=abs($\overline{I}_{ef}''$)·cos(phi'')>real_current_threshold
  b) Ief sin=imag($\overline{I}_{ef}''$)=abs($\overline{I}_{ef}''$)·sin(phi'')>imag_current_threshold
  c) phi_threshold1<phi''<phi_threshold2
  d) any combination of a)-c)
  phi'' is the phase angle difference between $\overline{U}_o''$ or $-\overline{U}_o''$ and $\overline{I}_{ef}''$ phasors during the earth fault. Alternatively phi'' is the phase angle difference between $\overline{U}_o''(t_{Fault})-\overline{U}_o''(t_{prefault})$ or $-(\overline{U}_o''(t_{Fault})-\overline{U}_o''(t_{prefault}))$ and $\overline{I}_{ef}''$ phasors.

In power based methods, the operation quantity is the earth-fault power $\overline{I}_{ef}''\cdot\overline{U}_o''$-phasor, whose amplitude, real- or imaginary part, or phase angle, for example, may be compared to a predefined threshold:
  a) Sef=abs($\overline{I}_{ef}''\cdot\overline{U}_o''$)>abs_power_threshold
  b) Pef=real($\overline{I}_{ef}''\cdot\overline{U}_{ef}''$)=abs($\overline{I}_{ef}''\cdot\overline{U}_o$)·cos(phi'')>real_power_threshold
  c) Qef=imag($\overline{I}_{ef}''\cdot\overline{U}_o''$)=abs($\overline{I}_{ef}''\cdot\overline{U}_o$)·sin(phi'')>imag_power_threshold
  d) phi_threshold1<phi''<phi_threshold2
  e) any combination a)-d)
  phi'' is the phase angle difference between $\overline{U}_o''$ or $-\overline{U}_o''$ and $\overline{I}_{ef}''$ phasors during the earth fault. Alternatively phi'' is the phase angle difference between $\overline{U}_o''(t_{Fault})-\overline{U}_o''(t_{prefault})$ or $-(\overline{U}_o''(t_{Fault})-\overline{U}_o''(t_{prefault}))$ and $\overline{I}_{ef}''$ phasors.

In admittance based methods, the operation quantity is the earth-fault admittance $\overline{I}_{ef}''/\overline{U}_o''$-phasor, whose amplitude, real- or imaginary part, or phase angle, for example, may be compared to a predefined threshold:
  a) Yef=abs($\overline{I}_{ef}''/\overline{U}_o''(t_{Fault})$)>abs_admittance_threshold, or
  b) Yef=abs($\overline{I}_{ef}''/(\overline{U}_o''(t_{Fault})-\overline{U}_o''(t_{prefault}))$)>abs_admittance_threshold
  c) Gef=real($\overline{I}_{ef}''/(\overline{U}_o''(t_{Fault}))$)=abs($\overline{I}_{ef}''/\overline{U}_o''(t_{Fault})$)·cos(phi)>real_admittance_threshold, or
  d) Gef=real($\overline{I}_{ef}''/(\overline{U}_o''(t_{Fault}))-\overline{U}_o''(t_{prefault}))$) abs($\overline{I}_{ef}''/(\overline{U}_o''(t_{Fault})-\overline{U}_o''(t_{prefault}))$)·cos(phi)>real_admittance_threshold
  e) Bef=imag($\overline{I}_{ef}''/(\overline{U}_o''(t_{Fault}))-$abs($\overline{I}_{ef}''/(\overline{U}_o''(t_{Fault}))$)·sin(phi)>imag_admittance_threshold, or
  f) Bef=imag($\overline{I}_{ef}''/(\overline{U}_o''(t_{Fault})-\overline{U}_o''(t_{prefault}))$) abs($\overline{I}_{ef}''/(\overline{U}_o''(t_{Fault})-\overline{U}_o''(t_{prefault}))$)·sin(phi)>imag_admittance_threshold
  g) phi_threshold1<phi''<phi_threshold2
  h) any combination a)-g)
  phi'' is the phase angle difference between $\overline{U}_o''$ or $-\overline{U}_o''$ and $\overline{I}_{ef}''$ phasors during the earth fault. Alternatively phi'' is the phase angle difference between $\overline{U}_o''(t_{Fault})-\overline{U}_o''(t_{prefault})$ or $-(\overline{U}_o''(t_{Fault})-\overline{U}_o''(t_{prefault}))$ and $\overline{I}_{ef}''$ phasors.

According to an embodiment, in a compensated network the current, power or admittance thresholds are not predetermined, but may be determined in real time. This may be performed by the Petersen coil regulator or another unit or system connected thereto, for example. The total system damping in amperes (Id) can be determined and may have a set detuning value in amperes (Iv).

From these values the thresholds can be determined automatically in real time:
  real_threshold≤Id*q2,
  imag_threshold≤Iv*q3,
  abs_threshold≤abs(Id+j*Iv)*q4
  where q2–q4<1 is a user defined security margin.

According to an embodiment, the direction of the phase-to-earth fault from the measuring point can then be determined 120 on the basis of the comparison. According to an embodiment, it may be determined that the direction of the fault is a first direction from the measuring point, if the result of the comparison is true and/or that the direction of the fault is a second direction from the measuring point, if the result of the comparison is false. For instance, in case the measuring point is located in the beginning of a line outlet, it may be determined that the direction of the fault is towards the line outlet, if the result of the comparison is true and/or that the direction of the fault is away from the line outlet, if the result of the comparison is false.

Alternatively or additionally, any of the above-described criteria can be combined with a neutral point voltage condition and/or a residual current condition, for example.

According to an embodiment, in order to obtain an accurate estimation of earth-fault current, the earth-fault current estimate phasor $\overline{I}_{ef}''$ preferably includes at least the fundamental frequency component (n=1).

According to an embodiment, the determination of the direction of the phase-to-earth fault from the measuring point may be performed by utilizing, in addition to the fundamental frequency, also one of more harmonic frequencies (n=2, 3, 4, 5, . . . ). For example, if the $5^{th}$ and $7^{th}$ harmonics are included, then in the current based method, the real- or imaginary part, or phase angle, is compared to the predefined threshold and:

The operating quantity based on real part of earth-fault current may be calculated as follows:
real($\overline{I}_{ef}$)=abs($\overline{I}_{ef}^1$)·cos(phi$^1$)+abs($\overline{I}_{ef}^5$)·cos(phi$^5$)+abs($\overline{I}_{ef}^7$)cos(phi$^7$)
phi$^1$ is the phase angle difference between $\overline{U}_o^1$ or $-\overline{U}_o^1$ and $\overline{I}_{ef}^1$ phasors during the earth fault.
phi$^5$ is the phase angle difference between $\overline{U}_o^5$ or $-\overline{U}_o^5$ and $\overline{I}_{ef}^5$ phasors during the earth fault.
phi$^7$ is the phase angle difference between $\overline{U}_o^7$ or $-\overline{U}_o^7$ and $\overline{I}_{ef}^7$ phasors during the earth fault.

The operating quantity based on imaginary part of earth-fault current may be calculated as follows:
imag($\overline{I}_{ef}$)=abs($\overline{I}_{ef}^1$)·sin(phi$^1$)+abs($\overline{I}_{ef}^5$)·sin(phi$^5$)+abs($\overline{I}_{ef}^7$)·sin(phi$^7$)
phi$^1$ is the phase angle difference between $\overline{U}_o^1$ or $-\overline{U}_o^1$ and $\overline{I}_{ef}^1$ phasors during the earth fault.
phi$^5$ is the phase angle difference between $\overline{U}_o^5$ or $-\overline{U}_o^5$ and $\overline{I}_{ef}^5$ phasors during the earth fault.
phi$^7$ is the phase angle difference between $\overline{U}_o^7$ or $-\overline{U}_o^7$ and $\overline{I}_{ef}^7$ phasors during the earth fault.

In the above exemplary equations the operating quantity represents the sum of amplitudes of the fundamental frequency and one or more harmonic component currents. From a fault detection perspective, this may ensure and improve selectivity as the operating quantity may become 'boosted' by the effect of the possible harmonics. In addition, dependability may be enhanced as the determination of the direction of the phase-to-earth fault detection is not solely dependent on the presence of harmonics or only on the fundamental frequency component, for example.

According to an embodiment, a given harmonic can be included if its magnitude exceeds a predetermined measurable threshold. This may be in practice a few amperes, for example. Any harmonic component or components may be included in the determination, if their magnitude is sufficient for an accurate measurement, for instance. Such a minimum value of a harmonic component magnitude may be a predetermined value and may be determined by the accuracy of the used hardware and applied measurement devices (such as CTs, VTs and or sensors), for example.

According to an embodiment, after the earth-fault current estimate is determined, the determination of the direction of the phase-to-earth fault can be implemented by including any current, power or admittance based methods as described previously, independently or by combining two or more of said methods. In addition, the conditions for determination of the direction of the phase-to-earth fault may include amplitude, real- or imaginary part, or phase angle thresholds independently or by combing several methods. Such thresholds may be used independently or together and they may depend on the electric network or system in which any of the embodiments described herein is applied. The determination of the direction of the phase-to-earth fault may be done locally and/or centrally by comparing the earth-fault current estimates of some or all the electric line outlets at the substation, for example.

According to an embodiment, the determined earth-fault current estimate phasor can be converted into an earth-fault admittance phasor with the zero-sequence voltage according to the following equations:

$$\overline{Y}_{ef}^n = \frac{\overline{I}_{ef}^n}{-(\overline{U}_{0\_tF}^n - \overline{U}_{0\_tP}^n)} = \frac{\overline{I}_{ef}^n}{-\Delta \overline{U}_0^n} = \text{Re}[\overline{Y}_{ef}^n] + j \cdot \text{Im}[\overline{Y}_{ef}^n] = G_{ef}^n + j \cdot B_{ef}^n \quad \text{Eq. 7a}$$

$$\overline{Y}_{ef}^n = \frac{\overline{I}_{ef}^n}{-\overline{U}_{0\_tF}^n} = \text{Re}[\overline{Y}_{ef}^n] + j \cdot \text{Im}[\overline{Y}_{ef}^n] = G_{ef}^n + j \cdot B_{ef}^n \quad \text{Eq. 7b}$$

The earth-fault admittance phasor $\overline{Y}_{ef}^n$ may be calculated by using discrete phasors of $\overline{I}_{ef}^n$ and $\overline{U}_o^n$ (or $\Delta \overline{U}_0^n$). Alternatively, the earth-fault admittance $\overline{Y}_{ef}^n$ can be calculated by using accumulated phasors of $\overline{I}_{ef}^n$ and $\overline{U}_0^n$ (or $\Delta \overline{U}_0^n$) during the earth-fault by using the Cumulative Phasor Sum (CPS) method as described in EP 2624397 A1. Notation of the calculated admittance in this case is $\overline{Y}_{ef\_stab}^n$, "Stabilized admittance", and it may be calculated according to Equations 7c-7d:

$$\overline{Y}_{ef\_stab}^n = \frac{CPS(\overline{I}_{ef}^n)}{CPS(-\Delta \overline{U}_0^n)} = \text{Re}[\overline{Y}_{ef\_stab}^n] + j \cdot \text{Im}[\overline{Y}_{ef\_stab}^n] = G_{ef\_stab}^n + j \cdot B_{ef\_stab}^n \quad \text{Eq. 7c}$$

$$\overline{Y}_{ef\_stab}^n = \frac{CPS(\overline{I}_{ef}^n)}{CPS(-\overline{U}_{0\_tF}^n)} = \text{Re}[\overline{Y}_{ef\_stab}^n] + j \cdot \text{Im}[\overline{Y}_{ef\_stab}^n] = G_{ef\_stab}^n + j \cdot B_{ef\_stab}^n \quad \text{Eq. 7d}$$

As in the case of a solid earth-fault (the fault resistance $R_F=0\Omega$) the value of $\underline{U}_o$ equals the phase-to-earth voltage of the system $U_{PE}$, the calculated $\overline{Y}_{ef}^n$ value or $\overline{Y}_{ef\_stab}^n$ value can be converted from the admittance domain into the current domain by using a fixed scalar conversion factor $U_{PE}$. Additionally, as the signs of the reactive components are reversed in the admittance domain, i.e. capacitive susceptance is positive and inductive susceptance is negative, the imaginary term of $\overline{Y}_{ef}^n$ or $\overline{Y}_{ef\_stab}^n$ should be reversed, i.e. by applying a complex conjugate. Finally, the conversion equation from admittance domain to current domain becomes:

$$\overline{I}_{ef}^{n*} = \text{conj}(\overline{Y}_{ef}^n) \cdot U_{PE} \quad \text{Eq. 7e}$$

or $$\overline{I}_{ef\_stab}^{n*} = \text{conj}(\overline{Y}_{ef\_stab}^n) \cdot U_{PE} \quad \text{Eq. 7f}$$

The admittance based earth-fault current estimate in the current domain $\overline{I}_{ef}^{n*}$ or $\overline{I}_{ef\_stab}^{n*}$, can also be scaled to match the actual value of earth-fault current when there is fault resistance involved in the fault. This can be achieved by multiplying the admittance based estimate of the earth-fault current $\overline{I}_{ef}^{n*}$, or $\overline{I}_{ef\_stab}^{n*}$ by the measured relative zero-sequence voltage magnitude $\text{abs}(\underline{U}_0^n)/U_{PE}$:

$$\overline{I}_{ef}^{n**} = \overline{I}_{ef}^{n*} \cdot \text{abs}(-\underline{U}_0^n)/\overline{U}_{PE} \quad \text{Eq. 8a}$$

or $$\overline{I}_{ef\_stab}^{n**} = \overline{I}_{ef\_stab}^{n*} \cdot \text{abs}(-\underline{U}_0^n)/U_{PE} \quad \text{Eq. 8b}$$

The notation $\overline{I}_{ef}^{n}$ or $\overline{I}_{ef\_stab}^{n}$ represents the admittance based earth-fault current estimate in current domain, which is obtained through conversion from the calculated admittance, taking into account the damping effect of fault resistance. The admittance based earth-fault current estimate $\overline{I}_{ef}^{n*}$, $\overline{I}_{ef\_stab}^{n*}$ or $\overline{I}_{ef}^{n}$, $\overline{I}_{ef\_stab}^{n}$ could be used in all calculations of the various embodiments described herein instead of earth-fault current estimate $\overline{I}_{ef}^n$.

A benefit of such admittance based equations possibly together with the CPS-calculation is that they can provide a very stable estimate of the earth-fault current regardless of fault type related oscillations (e.g. during re-striking earth fault) in the measured current and/or voltage quantities. This in turn enables a reliable and accurate implementation and performance of various applications using the earth-fault current estimate.

According to an embodiment, all earth-fault current estimates can be converted into earth-fault power with the measured zero-sequence voltage according to the following equations:

$$\overline{S}_{ef}^n = \text{conj}(\overline{I}_{ef}^n) \cdot (\overline{U}_{0\_tF}^n - \overline{U}_{0\_tP}^n) = \text{conj}(\overline{I}_{ef}^n) \cdot \Delta \overline{U}_0^n = \text{Re}[\overline{S}_{ef}^n] + j \cdot \text{Im}[\overline{S}_{ef}^n] = P_{ef}^n + j \cdot Q_{ef}^n \quad \text{Eq. 9a}$$

$$\overline{S}_{ef}^n = \text{conj}(\overline{I}_{ef}^n) \cdot \overline{U}_{0\_tF}^n = \text{Re}[\overline{S}_{ef}^n] + j \cdot \text{Im}[\overline{S}_{ef}^n] = P_{ef}^n + j \cdot Q_{ef}^n \quad \text{Eq. 9b}$$

The earth-fault power $\overline{S}_{ef}^n$, may be calculated using discrete phasors of $\overline{I}_{ef}^n$ and $\overline{U}_0^n$ (or $\Delta \overline{U}_0^n$).

Alternatively, the earth-fault power $\overline{S}_{ef}^n$ can be calculated by using accumulated phasors of $\overline{I}_{ef}^n$ and $\overline{U}_0^n$ (or $\Delta \overline{U}_0^n$) by using the cumulative phasor sum method as described in EP 2624397 A1.

$$\overline{I}_{ef}^n ** = \overline{I}_{ef}^n * \frac{\text{abs}(-\overline{U}_{0\_tF}^n)}{U_{PE}} \quad \text{Eq. 10a}$$

$$= \text{conj}(\overline{Y}_{ef}^n) \cdot U_{PE} \cdot \frac{\text{abs}(-\overline{U}_{0\_tF}^n)}{U_{PE}}$$

$$= \text{conj}\left(\frac{\overline{I}_{ef}^n}{-\overline{U}_{0\_tF}^n}\right) \cdot U_{PE} \cdot \frac{\text{abs}(-\overline{U}_{0\_tF}^n)}{U_{PE}}$$

$$= \text{conj}\left(\frac{\overline{I}_{ef}^n}{-\overline{U}_{0\_tF}^n}\right) \cdot \text{abs}(-\overline{U}_{0\_tF}^n)$$

or $$\overline{I}_{ef}^n ** = \text{conj}\left(\frac{CPS(\overline{I}_{ef}^n)}{CPS(-\overline{U}_{0\_tF}^n)}\right) \cdot \text{abs}(-\overline{U}_{0\_tF}^n) \quad \text{Eq. 10b}$$

The earth-fault power $\overline{S}_{ef}^n$ can then be calculated as:

$$\overline{S}_{ef}^n  = conj(\overline{I}_{ef}^n ) \cdot -\overline{U}_{0\_tF}^n = \qquad \text{Eq. 10c}$$

$$\frac{\overline{I}_{ef}^n}{-\overline{U}_{0\_tF}^n} \cdot abs(-\overline{U}_{0\_tF}^n) \cdot -\overline{U}_{0\_tF}^n = \overline{I}_{ef}^n \cdot abs(-\overline{U}_{0\_tF}^n)$$

or $$\overline{S}_{ef}^n  = conj(\overline{I}_{ef}^n ) \cdot -\overline{U}_{0\_tF}^n =$$

$$\frac{CPS(\overline{I}_{ef}^n)}{CPS(-\overline{U}_{0\_tF}^n)} \cdot abs(-\overline{U}_{0\_tF}^n) \cdot -\overline{U}_{0\_tF}^n$$

Operating quantities such as current, admittance or power determined from accumulated phasors by using the Cumulative Phasor Sum (CPS) method and the determined zero-sequence voltage or the determined change in the zero-sequence voltage can be used on a current based method, a power based method, an admittance based method or a combination thereof, for instance.

The various embodiments described herein provide the advantage that a detection of a faulty and healthy feeder (or feeder section), for example, based on the estimated earth-fault current increases the reliability of selective fault detection. For the calculation of earth-fault current in compensated networks the following equations are valid (full symmetry of the system is assumed).

Neutral point voltage during a single-phase earth fault:

$$\overline{U}_o = \frac{U_{PE}}{\overline{a}_{RF}} \qquad \text{Eq. 11}$$

The attenuation of neutral point voltage and earth-fault current due to fault resistance:

$$\overline{a}_{RF} = \frac{R_F \cdot (I_{Par} + I_{Coil} \cdot (d_{Coil} - j \cdot 1) + I_{EFNet} \cdot (d_{Net} + j \cdot 1)) + U_{PE}}{U_{PE}} \qquad \text{Eq. 12}$$

where $U_{PE}$ is the operating phase-to-earth voltage [V]

$I_{EFFd}$ is the capacitive earth-fault current produced by the protected feeder [A]

$I_{EFNet}$ is the uncompensated capacitive earth-fault current produced by the network [A]

$d_{Net}$ is a factor [pu] to approximate the natural losses of the feeder/network, typical value is between 0.01 ... 0.10 from $I_{EFNet}$ or $I_{EFFd}$ $I_{Coil}$ is the inductive current [A] produced by the ASC (ASC, Petersen coil) determined by the set tuning degree $d_{Coil}$ is a factor [pu] to approximate the losses of the ASC, typical value is between 0.01 ... 0.05 from $I_{Coil}$ $I_{Par}$ is the additional resistive current [A] at primary voltage level produced by the parallel resistor of the Arc Suppression Coil $R_F$ is fault resistance [ohm]

The earth-fault current measured at the beginning of a healthy feeder during a phase-to-earth fault:

$$\overline{I}_{ef}^{n\_OutsideEF} = 0 \qquad \text{Eq. 13}$$

The earth-fault current measured at the beginning of a faulty feeder during a phase-to-earth fault (fundamental frequency component):

$$\overline{I}_{ef}^{InsideEF} = \frac{I_{Par} + I_{Coil} \cdot (d_{Coil} - j \cdot 1) + (I_{EFNet}) \cdot (d_{Net} + j \cdot 1)}{\overline{a}_{RF}} \qquad \text{Eq. 14a}$$

or by re-arranging terms:

$$\overline{I}_{ef}^{InsideEF} = \frac{I_{Par} + I_{Coil} \cdot d_{Coil} + I_{EFNet} \cdot d_{Net} + j \cdot (I_{EFNet} - I_{Coil})}{\overline{a}_{RF}} \qquad \text{Eq. 14b}$$

The imaginary part of the nominator, the term $j \cdot (I_{EFNet} - I_{Coil})$ is the detuning degree of the network in amperes. The real part of the nominator equals the total network losses: the parallel resistor, losses of the coil and losses of the network.

Detection of the faulty and healthy feeder or feeder section based on estimation of earth-fault current as suggested by the various embodiments may have the following favorable features compared with methods based on residual current, for instance:

1. Earth-fault current $\overline{I}_{ef}^n$ measured in the healthy feeder during a single-phase earth fault is theoretically zero.

Thus, the magnitude of the total phase-to-earth admittance of the healthy feeder (feeder topology, connection status or share of underground cables) does not affect the earth-fault current $\overline{I}_{ef}^n$ estimate. This is advantageous, especially in case of healthy feeders with large total phase-to-earth admittance with small losses (e.g. long cable feeder). In such cases, the security of protection can be increased.

2. The earth-fault current $\overline{I}_{ef}^n$ estimate measured at the beginning of a faulty feeder during a single-phase earth fault better corresponds to the actual earth-fault current flowing at the fault location.

Thus, the magnitude of earth-fault current $\overline{I}_{ef}^n$ estimate is not affected or at least less affected by the share of the earth-fault current produced by the faulty feeder itself feeder (feeder topology, connection status or share of underground cables).

From a protection point of view, these facts may introduce the following benefits:

a) In case the network is operating in an undercompensated mode, and the degree of under-compensation equals the uncompensated capacitive earth-fault current produced by the protected feeder, the imaginary part of the residual current imag ($\vec{I}_o$) measured in this feeder during earth-fault condition equals in theory zero. However, the measured imaginary part of the earth-fault current estimate $\overline{I}_{ef}^n$ equals in theory at least the magnitude determined by the degree of under-compensation. This means that protection dependability is not only dependent on the resistive component of estimate earth-fault current (due to the losses of the network and the coil itself), but also on the measurable reactive part of earth-fault current.

b) Additionally harmonic components (n=2, 3, 4, . . . ) may be included in the earth-fault current estimate $\overline{I}_{ef}^n$ in addition to the fundamental frequency component (n=1) resulting in a higher measurable current at the faulty feeder during an earth-fault where harmonic components are present, for instance. Ability to include harmonic component to protection operation quantity enhances the dependability of protection.

c) The earth-fault current estimate $\bar{I}_{ef}''$ is not affected or at least less affected by protected feeder parameters (e.g. feeder topology, connection status or share of underground cables), but it is mainly dependent on the total network admittance. Thus, also in case the protected feeder has a high total phase-to-earth admittance compared with the total phase-to-earth admittance of the background network and the coil, earth faults inside such feeder can be detected dependably and selectively.

d) The total network admittance value can be easily determined by network parameters calculated by the coil controller in compensated networks, for example. It can also be easily calculated with basic network parameters for any high impedance earthed network. This enables very easy setting principles, or even automatic adaptation of settings in real time making use of the parameters calculated by the coil controller.

e) In case a coil (ASC) produces a very high inductive component compared with the capacitive component produced by the network admittances (when the network is operating in a highly overcompensated state), the high detuning value of the ASC is directly proportional to the magnitude of the earth-fault current estimate. Thus, the magnitude of the earth-fault current estimate can be used as a selective indication of a high earth-fault current condition in the network.

Such extreme and very challenging fault conditions can be easily taken into account by the various embodiments described herein.

3. Post-fault oscillations may not be seen in the earth-fault current estimate $\bar{I}_{ef}''$. When a fault arc becomes extinguished, the earth-fault current will become zero and it is not affected or at least less affected by the post-fault oscillations compared to the zero-sequence quantities. In such a condition, the security of protection can be increased.

4. As the earth-fault current estimate $\bar{I}_{ef}''$ measured at the beginning of a healthy feeder during a single-phase earth fault is theoretically zero and the earth-fault current estimate $\bar{I}_{ef}''$ measured at the beginning of a faulty feeder during a single-phase earth fault corresponds to the actual earth-fault current flowing at the fault location, the earth-fault detection method based on earth-fault current $\bar{I}_{ef}''$ estimate allows solely the magnitude to be used as a dependable protection quantity. Therefore, earth-fault protection in high-impedance earthed networks can operate selectively even without directional determination i.e. operate as non-directional. This has not been possible especially in compensated networks when traditional residual current quantity based methods have been used. Therefore, operation of protection can be enabled by simply monitoring the amplitude, real- or imaginary part, or phase angle, of earth-fault current estimate $\bar{I}_{ef}''$ at the protected feeder (standalone application), for example.

It is also possible to compare the amplitude, real- or imaginary part, or phase angle of earth-fault current estimates $\bar{I}_{ef}''$ between feeders at the substation and select the faulty one based on the comparison (centralized application).

The magnitude of the earth-fault current estimate $\bar{I}_{ef}''$ should preferably exceed some pre-set minimum value in order to take into account possible measurement inaccuracies.

Thus, selective protection is possible even without the parallel resistor of the Petersen coil (ASC), but this may require that the Petersen coil is not tuned to full resonance, and therefore operated slightly over- or undercompensated, for instance.

5. Because the earth-fault current magnitude is proportional to the hazard voltages at the fault location, protection can be made automatically adaptive based on the magnitude of the estimated earth-fault current.

Typically this may mean that an operation speed of protection can be increased when the earth-fault current increases and the operation time may be delayed in case the earth-fault current is small, for example.

6. Also setting principle of the earth-fault protection according to the various embodiments can be much simpler because setting threshold values could be determined directly based on the value of the expected earth-fault current estimate $\bar{I}_{ef}''$, for instance.

Especially, in compensated networks, settings would be very easy, as setting values could be based directly on the network parameters calculated by the coil controller (e.g. detuning value and network damping value), for example.

7. The earth-fault current estimate $\bar{I}_{ef}''$ can be further divided into magnitude, real- and imaginary parts. It can also be multiplied or divided with zero-sequence voltage, resulting in earth-fault power or earth-fault admittance based protection, for instance.

The proposed protection method and apparatus according to the various embodiments allow also harmonic components to be included in the estimate of the earth-fault current, making the solution much more accurate in modern power systems, where such harmonics are very likely to occur in practice.

The proposed protection method and apparatus according to the various embodiments can be an independent or a complementary protection function to existing residual voltage and current based earth-fault protection, for example.

An apparatus according to any one of the above embodiments, or a combination thereof, may be implemented as a single unit or as two or more units that are configured to implement the functionality of the various embodiments. Here the term 'unit' refers generally to a physical or logical entity, such as a physical device or a part thereof or a software routine. One or more of these units may reside in the protective relay unit 41, for example.

An apparatus for implementing the functionality according to any one of the embodiments may be implemented at least partly by means of one or more computers or corresponding digital signal processing (DSP) equipment provided with suitable software, for example. Such a computer or digital signal processing equipment preferably comprises at least a working memory (RAM) providing storage area for arithmetical operations, and a central processing unit (CPU), such as a general-purpose digital signal processor. The CPU may comprise a set of registers, an arithmetic logic unit, and a control unit. The CPU control unit is controlled by a sequence of program instructions transferred to the CPU from the RAM. The CPU control unit may contain a number of microinstructions for basic operations. The implementation of microinstructions may vary depending on the CPU design. The program instructions may be coded by a programming language, which may be a high-level programming language, such as C, Java, etc., or a low-level programming language, such as a machine language, or an assembler. The computer may also have an operating system which may provide system services to a computer program written with the program instructions. The computer or other apparatus implementing the invention, or a part thereof, may further comprise suitable input means for receiving e.g. measurement and/or control data, and output means for outputting e.g. control or other data. It is also possible to use a specific integrated circuit or circuits, or discrete electric components and devices for implementing the functionality according to any one of the embodiments.

The invention can be implemented in existing system elements, such as various protective relays or similar devices, or by using separate dedicated elements or devices in a centralized or distributed manner. Present protective devices for electric systems, such as protective relays, may comprise processors and memory that may be utilized in the functions according to the various embodiments described herein. Thus, all modifications and configurations required for implementing an embodiment in existing electric system components, may be performed as software routines, which may be implemented as added or updated software routines. If at least part of the functionality of the invention is implemented by software, such software may be provided as a computer program product comprising computer program code which, when run on a computer, causes the computer or corresponding arrangement to perform the functionality according to the embodiments as described herein. Such a computer program code may be stored or generally embodied on a computer readable medium, such as suitable memory, e.g. a flash memory or an optical memory, from which it is loadable to the unit or units executing the program code. In addition, such a computer program code implementing the invention may be loaded to the unit or units executing the computer program code via a suitable data network, for example, and it may replace or update a possibly existing program code.

It will be obvious to a person skilled in the art that, as the technology advances, the inventive concept can be implemented in various ways. The invention and its embodiments are not limited to the examples described above but may vary within the scope of the claims.

The invention claimed is:

1. A method for use in earth-fault protection in a three-phase electric network, comprising:
   detecting a phase-to-earth fault in the three-phase electric network;
   determining at a measuring point in the three-phase electric network, for each of the three phases of the three-phase electric network, a phase current during the detected phase-to-earth fault or a change in the phase current due to the detected phase-to-earth fault;
   detecting a faulted phase of the three-phase electric network;
   determining an estimate of an earth-fault current in a point of the detected phase-to-earth fault passing through the measuring point on the basis of the faulted phase and the determined phase currents of the three phases of the three-phase electric network, wherein the estimate is based on a negative-sequence current component, or on the basis of the faulted phase and the determined changes in the phase currents of the three phases of the three-phase electric network;
   determining a zero-sequence voltage of the three-phase electric network during the detected phase-to-earth fault or a change in the zero-sequence voltage of the three-phase electric network due to the detected phase-to-earth fault; and
   determining a direction of the phase-to-earth fault from the measuring point on the basis of the determined estimate of the earth-fault current and the determined zero-sequence voltage or on the basis of the determined estimate of the earth-fault current and the determined change in the zero-sequence voltage.

2. The method of claim 1, comprising operating the earth-fault protection in the three-phase electric network on the basis of the determined direction of the phase-to-earth fault from the measuring point.

3. The method of claim 2, wherein the operating of the earth-fault protection comprises:
   tripping one or more switching devices in the three-phase electric network and/or preventing a tripping of one or more switching devices in the three-phase electric network; and/or
   switching off or limiting the earth-fault current of the detected phase-to-earth fault in the three-phase electric network.

4. The method of claim 1, wherein the determining of the changes in the phase currents of the three phases of the three-phase electric network comprises:
   determining, for each of the three phases of the three-phase electric network, a difference between a fundamental frequency component of the phase current during the phase-to-earth fault and the fundamental frequency component of the phase current before the phase-to-earth fault.

5. The method of claim 4, wherein the estimate of the earth-fault current in the point of the detected phase-to-earth fault passing through the measuring point is determined by using at least one of: an equation based on a change in a negative-sequence current component, an equation based on a change in a positive-sequence current component, an equation based on changes of the phase currents.

6. The method of claim 1, wherein the determining of the changes in the phase currents of the three phases of the three-phase electric network comprises:
   determining, for each of the three phases of the three-phase electric network, and for at least one harmonic frequency, which is an integer multiple of the fundamental frequency of the phase current, a difference between a harmonic frequency component of the phase current during the phase-to-earth fault and the harmonic frequency component of the phase current before the phase-to-earth fault.

7. The method of claim 1, wherein the estimate of the earth-fault current in the point of the detected phase-to-earth fault passing through the measuring point is determined by using an equation based on the negative-sequence current component during the fault.

8. A computer program product comprising computer program code embodied on a non-transitory computer readable medium, wherein execution of the program code in a computer causes the computer to:
   monitor phase currents of the three-phase electric network;
   detect a phase-to-earth fault in the three-phase electric network;
   determine at a measuring point in the three-phase electric network, for each of the three phases of the three-phase electric network, a phase current during the detected phase-to-earth fault or a change in the phase current due to the detected phase-to-earth fault;
   detect a faulted phase of the three-phase electric network;
   determine an estimate of an earth-fault current in a point of the detected phase-to-earth fault passing through the measuring point on the basis of the faulted phase and the determined phase currents of the three phases of the three-phase electric network, wherein the estimate is based on a negative-sequence current component, or on the basis of the faulted phase and the determined changes in the phase currents of the three phases of the three-phase electric network;

determine a zero-sequence voltage of the three-phase electric network during the detected phase-to-earth fault or a change in the zero-sequence voltage of the three-phase electric network due to the detected phase-to-earth fault; and determine a direction of the phase-to-earth fault from the measuring point on the basis of the determined estimate of the earth-fault current and the determined zero-sequence voltage or on the basis of the determined estimate of the earth-fault current and the determined change in the zero-sequence voltage.

9. An apparatus for use in earth-fault protection in a three-phase electric network, comprising:

means configured to monitor phase currents of the three-phase electric network;

means configured to detect a phase-to-earth fault in the three-phase electric network;

means configured to determine at a measuring point in the three-phase electric network, for each of the three phases of the three-phase electric network, a phase current during the detected phase-to-earth fault or a change in the phase current due to the detected phase-to-earth fault;

means configured to detect a faulted phase of the three-phase electric network;

means configured to determine an estimate of an earth-fault current in a point of the detected phase-to-earth fault passing through the measuring point on the basis of the faulted phase and the determined phase currents of the three phases of the three-phase electric network, such that the estimate is based on a negative-sequence current component, or on the basis of the faulted phase and the determined changes in the phase currents of the three phases of the three-phase electric network;

means configured to determine a zero-sequence voltage of the three-phase electric network during the detected phase-to-earth fault or a change in the zero-sequence voltage of the three-phase electric network due to the detected phase-to-earth fault; and means configured to determine a direction of the phase-to-earth fault from the measuring point on the basis of the determined estimate of the earth-fault current and the determined zero-sequence voltage or on the basis of the determined estimate of the earth-fault current and the determined change in the zero-sequence voltage.

10. The apparatus of claim 9, comprising:

means configured to operate the earth-fault protection in the three-phase electric network on the basis of the determined direction of the phase-to-earth fault from the measuring point.

11. The apparatus of claim 10, wherein the means configured to operate the earth-fault protection comprise:

means configured to trip one or more switching devices in the three-phase electric network and/or to prevent a tripping of one or more switching devices in the three-phase electric network; and/or means configured to switch off or limit the earth-fault current of the detected phase-to-earth fault in the three-phase electric network.

12. The apparatus of claim 9, wherein the means configured to determine at the measuring point, for each of the three phases of the three-phase electric network, the change in the phase current due to the detected phase-to-earth fault are configured to:

determine, for each of the three phases of the three-phase electric network, a difference between a fundamental frequency component of the phase current during the phase-to-earth fault and the fundamental frequency component of the phase current before the phase-to-earth fault.

13. The apparatus of claim 12, wherein the means configured to determine the estimate of the earth-fault current are configured to determine the estimate of the earth-fault current in the point of the detected phase-to-earth fault passing through the measuring point by using at least one of: an equation based on a change in a negative-sequence current component, an equation based on a change in a positive-sequence current component, an equation based on changes of the phase currents.

14. The apparatus of claim 9, wherein the means configured to determine at the measuring point, for each of the three phases of the three-phase electric network, the change in the phase current due to the detected phase-to-earth fault are configured to:

determine, for each of the three phases of the three-phase electric network, and for at least one harmonic frequency, which is an integer multiple of the fundamental frequency of the phase current, a difference between a harmonic frequency component of the phase current during the phase-to-earth fault and the harmonic frequency component of the phase current before the phase-to-earth fault.

15. The apparatus of claim 9, wherein the means configured to determine the estimate of the earth-fault current are configured to determine the estimate of the earth-fault current in the point of the detected phase-to-earth fault passing through the measuring point by using an equation based on the negative-sequence current component during the fault.

16. An earth-fault protection device for a three-phase electric network, the device comprising a processor, and a memory storing instructions that, when executed by the processor, cause the device to:

monitor phase currents of the three-phase electric network;

detect a phase-to-earth fault in the three-phase electric network;

determine at a measuring point in the three-phase electric network, for each of the three phases of the three-phase electric network, a phase current during the detected phase-to-earth fault or a change in the phase current due to the detected phase-to-earth fault;

detect a faulted phase of the three-phase electric network;

determine an estimate of an earth-fault current in a point of the detected phase-to-earth fault passing through the measuring point on the basis of the faulted phase and the determined phase currents of the three phases of the three-phase electric network, wherein the estimate is based on a negative-sequence current component, or on the basis of the faulted phase and the determined changes in the phase currents of the three phases of the three-phase electric network;

determine a zero-sequence voltage of the three-phase electric network during the detected phase-to-earth fault or a change in the zero-sequence voltage of the three-phase electric network due to the detected phase-to-earth fault; and determine a direction of the phase-to-earth fault from the measuring point on the basis of the determined estimate of the earth-fault current and the determined zero-sequence voltage or on the basis of the determined estimate of the earth-fault current and the determined change in the zero-sequence voltage.

17. The earth-fault protection device of claim 16, wherein the device is configured to operate the earth-fault protection in the three-phase electric network on the basis of the determined direction of the phase-to-earth fault from the measuring point.

18. The earth-fault protection device of claim 16, wherein the device is configured to trip one or more switching devices in the three-phase electric network and/or to prevent a tripping of one or more switching devices in the three-phase electric network on the basis of the determined direction of the phase-to-earth fault from the measuring point.

19. The earth-fault protection device of claim 16, wherein the device is configured to switch off or limit the earth-fault current of the detected phase-to-earth fault in the three-phase electric network on the basis of the determined direction of the phase-to-earth fault from the measuring point.

* * * * *